United States Patent [19]

Altman et al.

[11] Patent Number: 4,827,326

[45] Date of Patent: May 2, 1989

[54] INTEGRATED CIRCUIT HAVING POLYIMIDE/METAL PASSIVATION LAYER AND METHOD OF MANUFACTURE USING METAL LIFT-OFF

[75] Inventors: Leonard F. Altman, Coral Springs, Fla.; Kevin D. Moore, Schaumburg, Ill.; John D. Shurboff, Palm City, Fla.

[73] Assignee: Motorola, Inc., Schaumberg, Ill.

[21] Appl. No.: 115,722

[22] Filed: Nov. 2, 1987

[51] Int. Cl.[4] .................. H01L 23/48; B44C 1/22; B29C 37/00

[52] U.S. Cl. ..................... 357/67; 156/644; 156/652; 156/655; 156/659.1; 156/668; 357/71; 430/313; 430/317; 437/203; 437/235

[58] Field of Search ............ 156/644, 652, 655, 659.1, 156/662, 668; 430/313, 314, 317; 357/40, 52, 65, 67-68, 71; 437/203, 228, 235

[56] References Cited

U.S. PATENT DOCUMENTS

| | | | |
|---|---|---|---|
| 4,113,550 | 9/1978 | Saiki et al. | 156/656 |
| 4,152,195 | 5/1979 | Bahrle et al. | 156/656 |
| 4,378,383 | 3/1983 | Moritz | 437/203 X |
| 4,411,735 | 10/1983 | Belani | 156/659.1 |
| 4,560,436 | 12/1985 | Bukhman | 156/643 |

OTHER PUBLICATIONS

Dillinger et al., Enhanced Via Etch Procedure for Silicon Nitride-Polyimide, IBM Tech. Disc. Bulletin, vol. 27, No. 2, Jul. 1984, pp. 1041-1043.
"Tape Automated Bonding Process for High Lead Count LSI", 1983 IEEE Publication 0569-5503/83/00-00-0221, pp. 221-225.

Primary Examiner—William A. Powell
Attorney, Agent, or Firm—Martin J. McKinley

[57] ABSTRACT

This process uses a metal lift-off step and results in a layer of polyimide covering the surface of an integrated circuit, except at the bonding pads which are covered by metals. A layer of polyimide is applied to the surface of an integrated circuit and then partially cured. A layer of positive photo-resist is applied over the polyimide layer and then pattern exposed and developed, resulting in windows being opened up over the bonding pads of the integrated circuit. The remaining photo-resist is then flood exposed. One or more metals are then sputtered over the resist and the bonding pads. The integrated circuit is then immersed in solvent and the remaining layer of photo-resist, including the metal above it, is lifted-off. Only the metal over the bonding pads remains. The polyimide layer is then fully cured.

6 Claims, 2 Drawing Sheets

INTEGRATED CIRCUIT HAVING POLYIMIDE/METAL PASSIVATION LAYER AND METHOD OF MANUFACTURE USING METAL LIFT-OFF

BACKGROUND OF THE INVENTION

This invention pertains to integrated circuit manufacturing processes and, more particularly, to a manufacturing process that passivates the surface of an integrated circuit.

To protect an integrated circuit, it is common to apply a passivation layer, for example, a layer of phosphoric silane glass (PSG), to the surface of the integrated circuit to act as a barrier to prevent corrosive chemicals from reaching the integrated circuit. There are several problems, however, that arise when PSG and similar passivation layers are used, without further passivation, to protect an integrated circuit in a non-hermetically sealed package, such as a plastic chip carrier. First, these passivation layers do not and can not be used to passivate aluminum bonding pads. Since aluminum is corrosion sensitive, prolonged exposure to environmental chemicals can corrode the aluminum bonding pads. Second, environmental moisture can enter small cracks in the passivation layer and combine with certain elements in the passivation to form corrosive chemicals, such as phosphoric acid, which can attack the underlying circuit, in particular, aluminum runners.

To overcome these problems, polyimide and metals have been used in the past to provide additional passivation. FIG. 1 illustrates an integrated circuit that has been passivated using the prior art etch-back process. Generally, the prior art process for applying this additional passivation begins with the application of a polyimide layer 102 to the surface of the integrated circuit wafer 104, followed by the use of photolithographic techniques to open up windows over the bonding pads 106. Next, one or more layers of metals 108 are applied and, using photolithographic techniques, the metal layer is etched-back such that each bonding pad now comprises an underlying layer of aluminum topped with one or more layers of metals.

One disadvantage of the prior art process is that it uses a metal etching step, thereby subjecting the underlying corrosion sensitive aluminum metallization to some risk. The prior art process also involves a number of photolithographic steps, and, for cost reduction, it would be desirable if the number of photolithographic steps could be reduced.

SUMMARY OF THE INVENTION

Briefly, the invention is a process for passivating an integrated circuit. A layer of polyimide is applied to the surface of an integrated circuit followed by a layer of photo-resist. Areas of the photo-resist and polyimide that overlie the bonding pads of the integrated circuit are then removed. A metal layer is then deposited over the photo-resist and the exposed bonding pads. The photo-resist, including the areas of the metal layer that overlie the photo-resist, is then lifted off.

BRIEF DESCRIPTION OF THE DRAWINGS

FIG. 2A illustrates the integrated circuit before the passivation process begins.

FIG. 2B illustrates the integrated circuit after the polyimide and photo-resist layers have been applied and the photo-resist layer has been pattern exposed.

FIG. 2C illustrates the integrated circuit after the photo-resist and polyimide layers have been developed to open up windows over the bonding pads.

FIG. 2D shows the integrated circuit after metal has been deposited over the photo-resist layer and the bonding pads.

FIG. 2E illustrates the integrated circuit at the completion of the process wherein the photoresist layer and the overlying metal layer are lifted-off.

DESCRIPTION OF THE PREFERRED EMBODIMENT

Figure 2A:
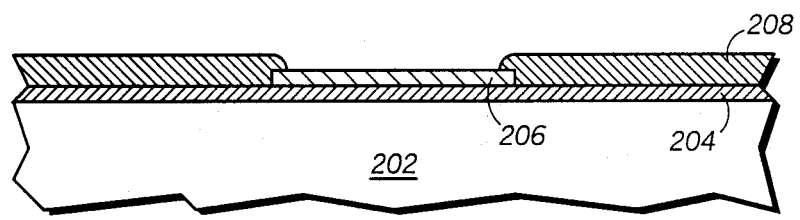
FIGS. 2A-2E are sectional views of an integrated circuit illustrating the structure that results at various stages of the lift-off passivation process of the present invention; more specifically.

Referring to FIG. 2A, the passivation process starts with a clean integrated circuit wafer that includes silicon substrate 202, silicon dioxide layer 204, aluminum bonding pad 206 and PSG (or similar) passivation layer 208.

Figure 2B:
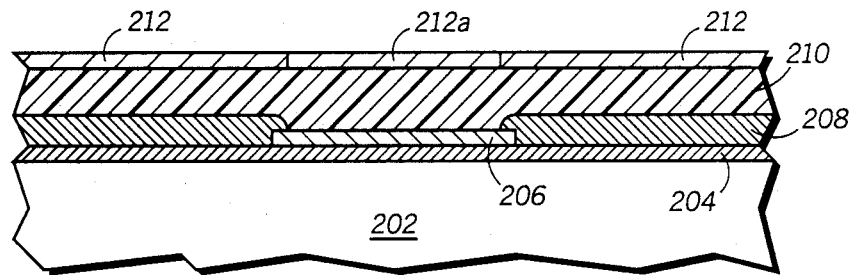

Referring to FIG. 2B, the process starts by applying an adhesion promoter, preferably DuPont VM-651 Adhesion Promoter, spin applied at 5000 RPM for 30 seconds. A layer of polyimide 210, preferably DuPont Pyralin TM, is then applied to the surface of the integrated circuit and partially cured by baking at 120° C. for 30 minutes. Polyimide layer 210 is spin or, preferably, spray applied to a thickness of 12 microns. A positive photo-resist layer 212, such as American Hoechsts AZ4620 positive resist, is applied over polyimide layer 210 to a thickness of about 6 microns by spinning at 4000 RPM for 20 seconds. The integrated circuit is then baked at 90° C. for 20 minutes in air. Using a photo-tool, the area 212a of photo-resist layer 212 that lies over bonding pad 206 is exposed to ultraviolet light using a mercury lamp. The exposure energy is approximately 250 millijoules.

Figure 2C:
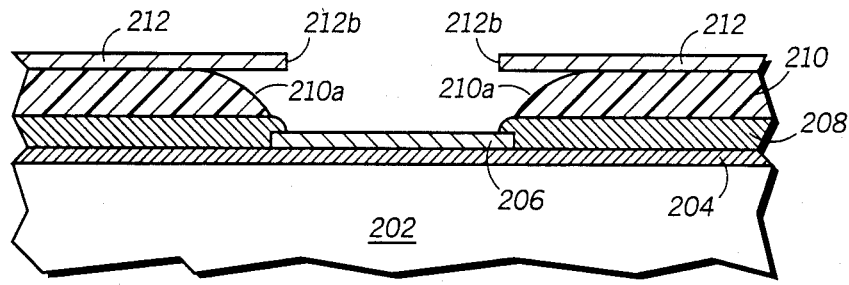

Referring to FIG. 2C, the integrated circuit is then immersed in a developer, such as sodium or potassium hydroxide, which removes areas 212a of photo-resist layer 212 and the underlying areas of polyimide layer 210. The developer is preferably three parts deionized water and one part American Hoechsts AZ400K developing solution which is heated to 35° C. After developing, the integrated circuit is then spin rinsed in deionized water to 12 Megohms and then spin dried. The results of the developing step are a clean exposure of aluminum bond pad 206 and isotropic etching of polyimide layer 210 which creates sloping polyimide sidewalls 210a and an overhang 212b of resist layer 212. The integrated circuit is then flood exposed to ultraviolet light using a mercury vapor lamp. The exposure energy is approximately 500 millijoules.

Figure 2D:
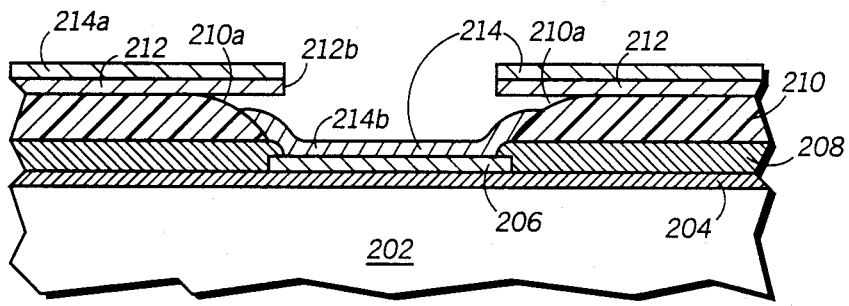

Referring to FIG. 2D, the integrated circuit is then sputter etched at 500 watts for 1 minute and, then, one or more metal layers 214 are deposited over the entire surface of the integrated circuit. Preferably, metal layer 214 consists of a nickel-chromium layer followed by a copper layer which are sputtered deposited to 2000 and 5000 Angstroms, respectively. Although NiCr and Cu are preferred, other metals may also be utilized, such as nickel or gold. The result of the metal deposition step is a layer of metal 214a over remaining resist layer 212 and a layer of metal 214b over bonding pad 206. The layer of metal 214b covering bonding pad 206 also covers the lower portion of sloping polyimide sidewalls 210a, gradually tapering off such that no metal covers the upper portion of the sloping polyimide sidewalls. The heat of the sputter deposition of metal layer 214 causes the remaining photo-resist layer 212 to decompose, cracking the metal above it. This cracking of metal layer 214a aids in the lift-off process described below.

Figure 2E:
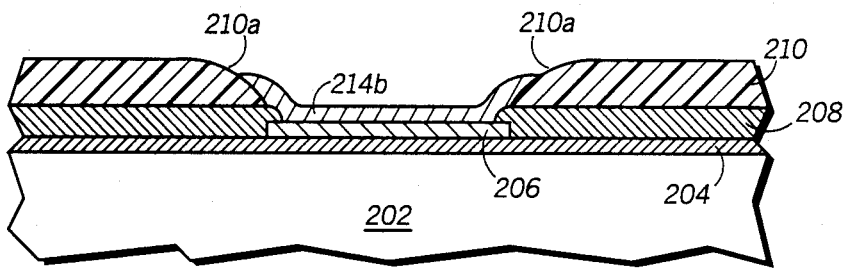

Referring to FIG. 2E, the integrated circuit is then immersed in a solvent, such as boiling acetone, to lift-off the remaining photo-resist layer 212 and the layer of metal 214 immediately above the photo-resist. Ultrasonics can also be used to speed up the lift-off process. Finally, the remaining polyimide layer 210 is then fully cured by baking it in a nitrogen atmosphere for 30 minutes at 90° C. and 30 minutes at 150° C., followed by an infrared heat cycle. This completes the passivation process.

The result of this process is an integrated circuit with a layer of polyimide 210 covering its entire surface, except the bonding pads which are covered by a layer of metal 214b. This layer of metal 214b also covers the lower portion of sloping sidewalls 210a of polyimide layer 210, thereby providing contiguous passivation of the entire surface of the integrated circuit. Since the metal bonding pad areas 214b are defined by a metal lift-off process and not by conventional photolithographic etch-back techniques, there are no corrosive etching chemicals that could attack the underlying aluminum structures, such as bonding pad 206, through small holes or cracks in one of the upper layers of the integrated circuit. Since the present lift-off process uses fewer steps (in particular, fewer photolithographic process steps) than the prior art etch-back process, the lift-off process is simpler and cheaper to use. In addition to wire bonding, an integrated circuit manufactured with this lift-off process can be interconnected to a circuit substrate by direct soldering or tape automated bonding.

Figure 1:
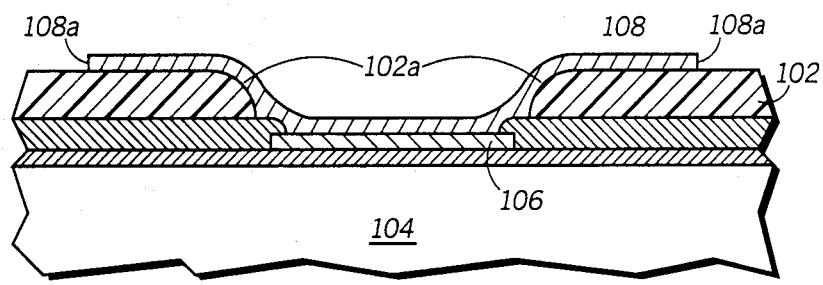
FIG. 1 is a sectional view of an integrated circuit passivated by a prior art etch-back process.

A comparison of prior art FIG. 1 and FIG. 2E illustrates the structural differences between an integrated circuit manufactured by the lift-off process and one manufactured by the prior art etchback process. In the prior art etch-back process, the passivation metal layer 108 extends well beyond the polyimide sidewalls 102a and abruptly ends at wall 108a, thereby creating an irregularity in the passivation surface. In the lift-off process, however, metal layer 214b does not completely overlap sloping polyimide sidewalls 210a, but gradually tapers into the sidewalls, resulting in a smooth passivation surface that lacks the abrupt surface changes (at 108a) produced by the prior art etch-back process These differences are dramatically visible upon microscopic examination of the surfaces of different integrated circuits manufactured by these two processes.

We claim as our invention:

1. A process for passivating an integrated circuit, comprising the steps of:

applying a layer of polyimide to the surface of an integrated circuit;

applying a layer of photo-resist over said layer of polyimide;

removing areas of said layer of photoresist and areas of said layer of polyimide that overlie the bonding pads of said integrated circuit;

depositing a metal layer over said layer of photo-resist and over the exposed bonding pads; and lifting-off said layer of photo-resist including the areas of said metal layer that overlie said layer of photo-resist.

2. An integrated circuit manufactured by the process of claim 1.

3. A process for passivating an integrated circuit, comprising the steps of:

applying a layer of polyimide to the surface of an integrated circuit;

partially curing said layer of polyimide;

applying a layer of photo-resist over said layer of polyimide;

removing areas of said layer of photo-resist and areas of said layer of polyimide film that overlie the bonding pads of said integrated circuit;

flood exposing said layer of photo-resist;

depositing a layer of metal over said layer of polyimide and over said bonding pads;

lifting-off said layer of photo-resist including the areas of said layer of metal that overlie said layer of photo-resist; and further curing said layer of polyimide.

4. An integrated circuit manufactured by the process of claim 3.

5. A process for passivating an integrated circuit, comprising the steps of:

applying a layer of polyimide to the surface of an integrated circuit;

partially curing said layer of polyimide;

applying a layer of positive photo-resist over said layer of polyimide;

pattern exposing said layer of photo-resist such that areas of said photo-resist that overlie the bonding pads of said integrated circuit are exposed to light;

emersing said integrated circuit in a developer such that the exposed areas of said photo-resist and the areas of said polyimide layer that underlie said exposed areas of said photo-resist are removed;

flood exposing said layer of photo-resist;

depositing a layer of metal over said layer of polyimide and over said bonding pads;

emersing said integrated circuit in a solvent to lift-off said layer of photo-resist including the areas of said layer of metal that overlie said layer of photo-resist; and further curing said layer of polyimide.

6. An integrated circuit manufactured by the process of claim 5.

* * * * *